United States Patent
Okumura et al.

[19]

[11] Patent Number: 5,916,820

[45] Date of Patent: Jun. 29, 1999

[54] THIN FILM FORMING METHOD AND APPARATUS

[75] Inventors: Tomohiro Okumura, Neyagawa; Ichiro Nakayama, Kadoma; Yuichiro Yamada, Suita; Naoki Suzuki, Neyagawa, all of Japan

[73] Assignee: Matsushita Electric Industrial Co., Ltd., Osaka-fu, Japan

[21] Appl. No.: 08/518,307

[22] Filed: Aug. 23, 1995

[30] Foreign Application Priority Data

Aug. 24, 1994 [JP] Japan .................................. 6-199527

[51] Int. Cl.⁶ ............................. H01L 21/00; H05H 1/24
[52] U.S. Cl. .............................. 438/694; 216/37; 216/38; 216/67; 216/68; 216/79; 427/569; 427/579; 438/695; 438/697; 438/710; 438/723; 438/724
[58] Field of Search .................................. 216/37, 38, 67, 216/68, 79; 156/643.1, 646.1, 657.1, 662.1; 427/569, 579; 438/694, 695, 697, 699, 703, 710, 723, 724

[56] References Cited

U.S. PATENT DOCUMENTS

| 4,668,365 | 5/1987 | Foster et al. ............................... 216/37 |
| 4,775,550 | 10/1988 | Chu et al. ................................. 427/569 |
| 4,795,529 | 1/1989 | Kawasaki et al. ......................... 216/37 |
| 4,950,624 | 8/1990 | Inuzima et al. ........................... 427/569 |
| 5,026,666 | 6/1991 | Hills et al. ................................. 216/67 |
| 5,513,765 | 5/1996 | Usui .......................................... 216/68 |
| 5,614,055 | 3/1997 | Fairbairn et al. ......................... 216/68 |

OTHER PUBLICATIONS

"Review of Inductively Coupled Plasmas for Plasma Processing", by J. Hopwood, Plasma Sources Sci. Technol. 1 (1992), pp. 109–116.

*Primary Examiner*—T. Tung
*Attorney, Agent, or Firm*—Wenderoth, Lind & Ponack, L.L.P.

[57] ABSTRACT

A thin film forming method for forming a thin film on a surface of a substrate having a stepped portion due to a difference in level, includes steps of performing first thin film deposition with plasma generated in a processing chamber by applying high-frequency voltages to electrodes, performing thin film shaping with plasma generated in the processing chamber by applying a high-frequency voltage to a coil, and performing second thin film deposition with plasma generated in the processing chamber by applying high-frequency voltages to the electrodes.

15 Claims, 10 Drawing Sheets

THIN FILM FORMING METHOD AND APPARATUS

BACKGROUND OF THE INVENTION

The present invention relates to a thin film forming method and apparatus, and in particular, to a thin film forming method and apparatus capable of forming a quality thin film at a high velocity on a surface of a substrate having particularly a stepped portion.

Particularly in processes subsequent to aluminum wiring formation among processes of manufacturing a semiconductor integrated circuit, there is widely used a plasma CVD method capable of forming a film at a low temperature as a method for forming a silicon oxide film or a silicon nitride film.

FIG. 8 shows a construction of a thin film forming apparatus used generally for manufacturing a semiconductor integrated circuit. In FIG. 8, an upper electrode 52 and a lower electrode 53 are arranged in parallel with each other inside a processing chamber 41. A semiconductor substrate 10 is disposed on the lower electrode 53. The upper electrode 52 is provided with gas inlets 54 on a side thereof facing the lower electrode 53. The upper electrode 52 is connected to a high-frequency power source 55 for upper electrode use, while the lower electrode 53 is connected to a high-frequency power source 56 for lower electrode use.

By introducing TEOS (tetraethyl orthosilicate) and oxygen as a reaction gas from the gas inlets 54 into the processing chamber 41 while discharging a gas in the chamber 41 therefrom, and applying high-frequency powers to the upper electrode 52 and the lower electrode 53 with the processing chamber 41 maintained internally at an appropriate pressure, plasma is generated inside the processing chamber 41, and a silicon oxide film is formed on the substrate 10. Otherwise, when silane, nitrogen, and ammonia are used instead of TEOS and oxygen, a silicon nitride film can be formed.

Accordingly as semiconductor devices have been improved in their level of integration, there has been a growing demand for forming a film while assuring a good covering performance on a stepped portion having a great aspect ratio (a ratio of a height to a bottom length of the stepped portion). However, according to the aforementioned film formation by means of the plasma CVD apparatus, it has been difficult to form a film while assuring a good covering performance on a stepped portion as described above. When an insulating film 70 is deposited on such a stepped portion, a cavity referred to as a void 71 is disadvantageously formed as shown in FIG. 10.

In view of the above, there has been performed a complex process for forming an insulating film free of voids through a by the plasma CVD method, and several representative techniques will be described below.

FIGS. 11A through 11D show a sandwich method. In FIGS. 11A through 11D, on a stepped portion 72 as shown in FIG. 11A, firstly an insulating film 73 is deposited by the plasma CVD method as shown in FIG. 11B. Then, SOG (Spin On Glass: Glass coated by spinning) is coated, and thereafter baking is performed to form a SOG layer 74 as shown in FIG. 11C. For the coating of SOG, a special coater is used. Then, an insulating film 75 is deposited by the plasma CVD method as shown in FIG. 11D. The SOG layer has an excellent stepped portion covering performance, has an inferior film property as an insulating film. The above-mentioned fact is the reason for providing the sandwich structure in which the SOG layer is sandwiched between the plasma CVD films each having a good film property. In place of SOG, a resin such as a resist is sometimes employed. When a resin is employed, a sandwich structure is still required for the same reasons as in the case of SOG.

FIGS. 12A through 12F show an etch back method. In FIGS. 12A through 12F, on a stepped portion 76 as shown in FIG. 12A, firstly an insulating film 77 is deposited by the plasma CVD method as shown in FIG. 12B. Then, a sputter etching process is performed by means of oxygen or argon plasma as shown in FIG. 12C so as to remove shoulder portions 77a of the insulating film 77. It is to be noted that the sputter etching process is performed by a dry etching apparatus having two electrodes in a vacuum vessel. Then, an insulating film 78 is deposited by the plasma CVD method as shown in FIG. 12D. Formation of an insulating film formation free of voids has been completed through the above-mentioned process stages. However, when an improved flatness is required, a resin layer 79 such as a resist is formed on the insulating film 78 as shown in FIG. 12E. Finally, by effecting a dry etching process with an etch selectivity of the resin layer 79 to the insulating film 78 being is 1:1 as shown in FIG. 12F, a flat insulating film 78 is formed without leaving the resin layer 79.

Further, there is proposed an ECR bias CVD method capable of forming a flat thin film in a single process. In FIG. 13 showing an approximate structure of an ECR bias CVD apparatus, an appropriate gas is introduced into a vacuum vessel 81 while a gas in the vessel 81 is discharged, and while a microwave generated by a microwave generator 86 is radiated into a discharge tube 85 via a waveguide tube 87 with the discharge tube 85 maintained internally at an appropriate pressure. Meanwhile, a static magnetic field is generated inside the discharge tube 85 by causing a direct current to flow through a static magnetic field generating coil 88 provided outside the discharge tube 85. Then, due to an interaction between a microwave electric field and the static magnetic field, an electron cyclotron motion is excited for electrons inside the discharge tube 85, thereby generating plasma. It is to be noted that an electrode 82 is connected to a high-frequency power source 84 for electrode use so that the electrode can control energy of ions to be incident on a substrate 83.

FIGS. 14A through 14D show a thin film forming process which is carried out by means of the ECR bias CVD apparatus. In FIGS. 14A through 14D, when an insulating film is formed on a stepped portion 90 as shown in FIG. 14A, sputter etching is effected simultaneously with thin film deposition. Therefore, thin film formation progresses in a manner as shown in FIGS. 14B through 14D, thereby obtaining a flat insulating film 91 free of voids.

However, each of the thin film forming methods and apparatuses as described above have issues as follows.

In terms of structure, the sandwich method has the portion having an inferior film property such as SOG and resin in the insulating film. Therefore, a defect such as reduction of dielectric strength or deterioration of aluminum wiring may occur due to moisture contained in, for example, SOG, and an achievable flatness is inferior to the other methods. Therefore, it is inappropriate to apply this method to a stepped portion of a device where the aspect ratio is not smaller than one and the length of a bottom portion of the stepped portion is not greater than 0.8 μm.

The etch back method, which does not, in the end, leave a portion having an inferior film property such as SOG and resin in the insulating film, has no disadvantage in terms of film quality. However, this method has a drawback that it has a small throughput because considerable time is required for the shaping process (shoulder removal process) performed by the dry etching apparatus having two electrodes in the vacuum vessel.

The ECR bias CVD method is more advantageous than the foregoing two methods in that film formation can be achieved in one process. However, since the processing with ECR plasma is performed in an intense magnetic field, this method has a fatal drawback that a thin insulating film (e.g., gate oxide film) fabricated in a device suffers a dielectric breakdown due to electrostatic charges. Therefore, though the method has been regarded as a promising one, practically the method has not been used in mass production. If the issue of dielectric breakdown is solved, the ECR plasma CVD apparatus is disadvantageously very expensive because the microwave generator 86 is expensive. Therefore, in order to reduce a substrate processing cost to a reasonable value, a substantial increase of film formation velocity is required.

SUMMARY OF THE INVENTION

An object of the present invention is therefore to provide a thin film forming method and apparatus capable of forming a quality thin film at a high velocity on a substrate surface having a stepped portion.

In accomplishing these and other objects, according to a first aspect of the present invention, there is provided a thin film forming method for forming a thin film on a surface of a substrate having a stepped portion due to a difference in level, comprising steps of:

performing first thin film deposition with plasma generated in a processing chamber by applying high-frequency voltages to electrodes;

performing thin film shaping with plasma generated in the processing chamber by applying a high-frequency voltage to a coil; and performing second thin film deposition with plasma generated in the processing chamber by applying high-frequency voltages to the electrodes.

According to a second aspect of the present invention, there is provided a thin film forming method for forming a thin film on a surface of a substrate having a stepped portion due to a difference in level, comprising steps of:

performing first thin film deposition with plasma generated in a processing chamber by applying high-frequency voltages to electrodes; and simultaneously performing second thin film deposition and thin film shaping with plasma generated in the processing chamber by applying a high-frequency voltage to a coil.

According to a third aspect of the present invention, there is provided a thin film forming method for forming a thin film on a surface of a substrate having a stepped portion due to a difference in level, comprising steps of:

simultaneously performing first thin film deposition and thin film shaping with plasma generated in a processing chamber by applying a high-frequency voltage to a coil; and performing second thin film deposition with plasma generated in the processing chamber by applying high-frequency voltages to electrodes.

According to a fourth aspect of the present invention, there is provided a thin film forming apparatus comprising:

a processing chamber implemented by a vacuum vessel;

an electrode for substrate use, which is arranged in the processing chamber and on which a substrate is to be disposed;

an opposite electrode arranged in opposition to the substrate use electrode in the processing chamber;

a high-frequency power source for opposite electrode use, for applying a high-frequency voltage to the opposite electrode;

a coil for generating a high-frequency discharge; and a high-frequency power source for coil use, for applying a high-frequency voltage to the coil.

According to a fifth aspect of the present invention, there is provided a thin film forming apparatus comprising:

a first processing chamber including an electrode for substrate use, on which a substrate is disposed and an opposite electrode for generating a high-frequency discharge, both the electrodes being placed inside a vacuum vessel; and a second processing chamber including an electrode for substrate use, on which a substrate is disposed inside a vacuum vessel and a coil for generating a high-frequency discharge provided for the vacuum vessel.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
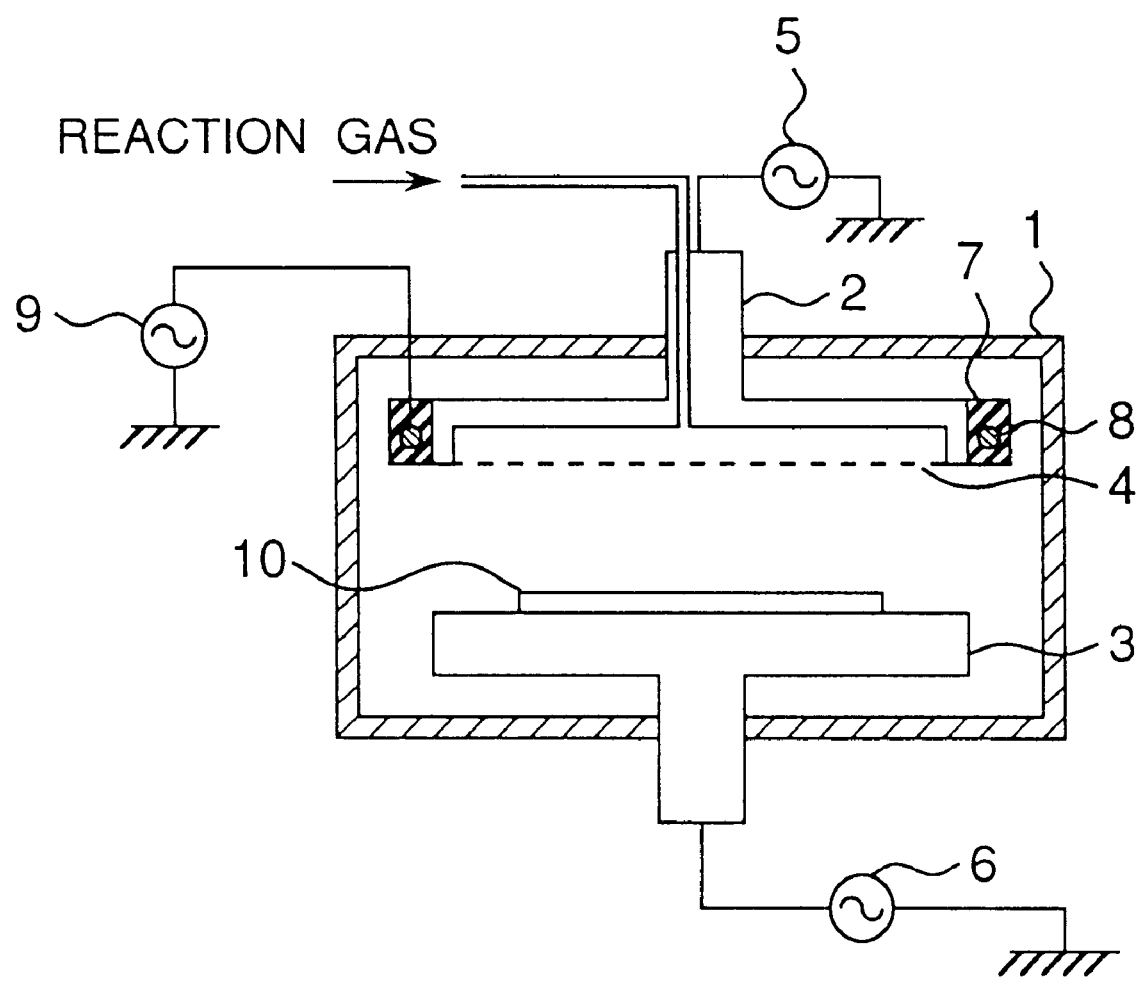
FIG. 1 is a diagram showing a structure of a thin film forming apparatus according to a first embodiment of the present invention.

Before the description of the present invention proceeds, it is to be noted that like parts are designated by like reference numerals throughout the accompanying drawings.

A thin film forming apparatus according to a first embodiment of the present invention will be described with reference to FIGS. 1 and 2A through 2F.

In FIG. 1, an upper electrode 2 and a lower electrode 3 are placed in parallel with each other in a processing chamber 1 implemented by a vacuum vessel. The lower electrode 3 functions as an electrode for substrate use on which a substrate 10 is to be disposed, while the upper electrode 2 functions as an opposite electrode arranged in opposition to the electrode 3. The upper electrode 2 has numerous of gas inlets 4 each having a hole diameter of 0.5 mm on a side opposite to the lower electrode 3. The upper electrode 2 is connected to a high-frequency power source 5 for upper electrode use, while the lower electrode 3 is connected to a high-frequency power source 6 for lower electrode use. The upper electrode 2, lower electrode 3, upper electrode high-frequency power source 5, and lower electrode high-frequency power source 6 constitute a means for generating a so-called capacitive coupling type electrical discharge. An insulating ring 7 is provided around the upper electrode 2, while a coil 8 is provided in the insulating ring 7. One end of the coil 8 is connected to a high-frequency power source 9 for coil use and the other end of the coil 8 is grounded. The coil 8 and the coil high-frequency power source 9 constitute a means for generating a so-called inductive coupling type electrical discharge.

In the above-mentioned construction, by disposing the substrate 10 on the lower electrode 3, introducing a reaction gas from the gas inlets 4 into the processing chamber 1 while discharging a gas in the chamber 1 therefrom, and applying high-frequency voltages to the upper electrode 2 and the lower electrode 3 with the processing chamber 1 maintained internally at an appropriate pressure, a so-called capacitive coupling type electrical discharge is generated in the processing chamber 1. When a mixed gas including, for example, TEOS and oxygen is used as the reaction gas, a silicon oxide film can be deposited on the substrate 10.

Otherwise, by introducing the reaction gas from the gas inlets 4 into the processing chamber 1 while discharging the gas therefrom, and applying a high-frequency voltage to the coil 8, a so-called inductive coupling type electrical discharge is generated in the processing chamber 1. When the inductive coupling type electrical discharge is used, a high-frequency voltage is also applied to the lower electrode 3 so as to control ion energy.

When, for example, oxygen or argon is used as the reaction gas, shaping (shoulder removal) of the thin film on the substrate 10 can be performed. Otherwise, when, for example, a mixed gas including TEOS, oxygen, and argon is used as the reaction gas, a silicon oxide film can be deposited on the substrate 10 while simultaneously effecting shaping (shoulder removal) of the silicon oxide film by sputter etching.

Figure 2A:
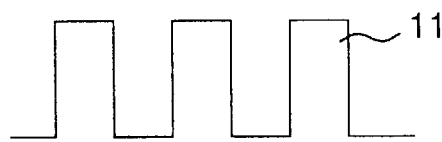
FIGS. 2A, 2B, 2C, 2D, 2E, and 2F, are schematic views of a first thin film forming process of the first embodiment.
Figure 2B:
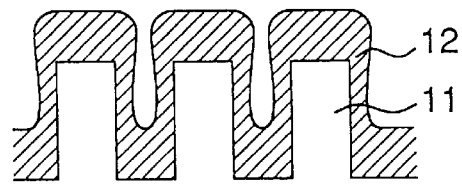
Figure 2C:
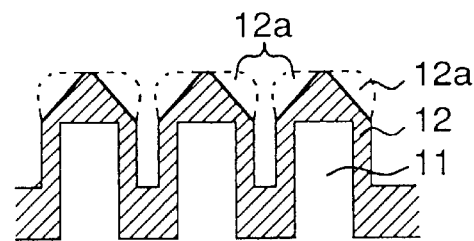
Figure 2D:
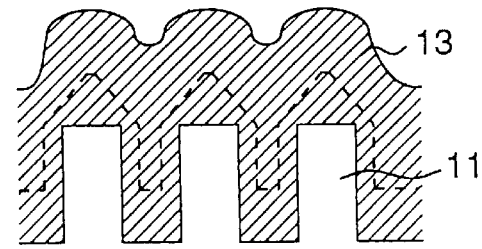
Figure 2E:
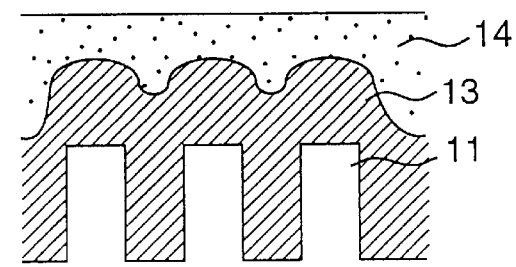
Figure 2F:
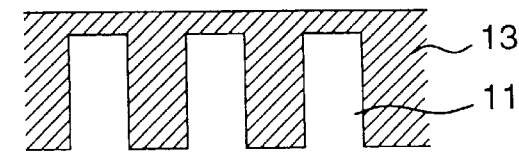

FIGS. 2A through 2F show schematic views of a process for forming a silicon oxide film on a stepped portion of aluminum having an aspect ratio of 1.25 (a height of 1 $\mu$m relative to the length of 0.8 $\mu$m of a bottom portion of the stepped portion) using the apparatus of FIG. 1. In FIGS. 2A through 2F, on a stepped portion 11 as shown in FIG. 2A, firstly a silicon oxide film 12 is deposited by a thickness of 0.5 $\mu$m using the capacitive coupling type electrical discharge as shown in FIG. 2B. The amount of deposition reaches a maximum limit just before an open end of each recess portion due to the stepped portion 11 is closed by the thin film 12 deposited on the substrate surface, and practically an appropriate opening is left at an upper end of each recess portion. There is provided a deposition condition of: a TEOS flow rate of 80 sccm and an oxygen flow rate of 200 sccm; a pressure of 6 Torr; and high-frequency powers of 360 W and 120 W to be applied respectively to the upper electrode 2 and the lower electrode 3. Then, sputter etching is effected by means of argon plasma using the inductive coupling type electrical discharge as shown in FIG. 2C so as to perform shoulder removal (shaping) of the silicon oxide film 12. That is, shoulders 12a are removed from the silicon oxide film 12. The shaping process by the sputter etching is effected until a portion having a narrow width substantially disappears on the open end side relative to a bottom portion of each recess portion. By the above-mentioned process, possible generation of voids can be prevented in the next stage. There is provided a sputter etching condition of: an argon flow rate of 50 sccm; a pressure of 5 mTorr; and high-frequency powers of 800 W and 100 W to be applied respectively to the coil 8 and the lower electrode 3. No high-frequency power is applied to the upper electrode 2. Then, a silicon oxide film 13 is deposited by a thickness of 1 $\mu$m using again the capacitive coupling type electrical discharge as shown in FIG. 2D. A provided deposition condition is the same as the preceding silicon oxide film deposition condition using the capacitive coupling type electrical discharge. Through the aforementioned process, formation of a silicon oxide film free of voids is completed. However, if a further flatness is required, a resin layer 14 such as a resist is formed on the silicon oxide film 13 as shown in FIG. 2E. Finally, by performing a dry etching process with an etch selectivity of the resin layer 14 to the silicon oxide film 13 being 1:1 as shown in FIG. 2F, a flat silicon oxide film can be obtained without leaving the resin layer 14.

Figure 3A:
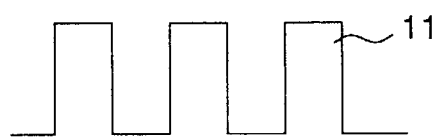
FIGS. 3A, 3B, 3C, 3D, 3E, and 3F are schematic views of a second thin film forming process of the first embodiment.
Figure 3B:
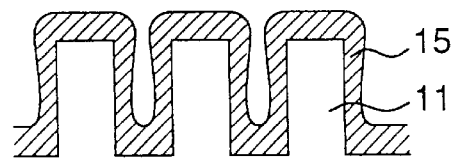
Figure 3C:
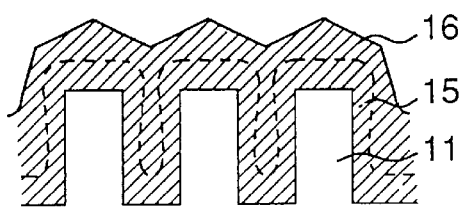

Next, a second thin film forming method for forming a silicon oxide film on a similar stepped portion of aluminum by means of the thin film forming apparatus shown in FIG. 1 will be described with reference to FIGS. 3A through 3F. In FIGS. 3A through 3F, on a stepped portion 11 as shown in FIG. 3A, firstly a silicon oxide film 15 is deposited by a thickness of 0.3 $\mu$m using the capacitive coupling type electrical discharge as shown in FIG. 3B. The amount of deposition is required to be limited within a range in which no recess portion is left as a void due to the stepped portion in the next process of performing thin film deposition and thin film shaping, and therefore the deposition is preferably effected up to a maximum film thickness within the range. There is provided a deposition condition of: a TEOS flow rate of 80 sccm and an oxygen flow rate of 200 sccm; a pressure of 6 Torr; and high-frequency powers of 360 W and 120 W to be applied respectively to the upper electrode 2 and the lower electrode 3. Then, CVD reaction and sputter etching are simultaneously effected using the inductive coupling type electrical discharge as shown in FIG. 3C so as to perform deposition and shoulder removal (shaping) of the silicon oxide film 16. There is provided a processing condition of: a TEOS flow rate of 20 sccm, an oxygen flow rate of 50 sccm, and an argon flow rate of 50 sccm; a pressure of 5 mTorr; and high-frequency powers of 1000 W and 200 W to be applied respectively to the coil 8 and the lower electrode 3.

Figure 3D:
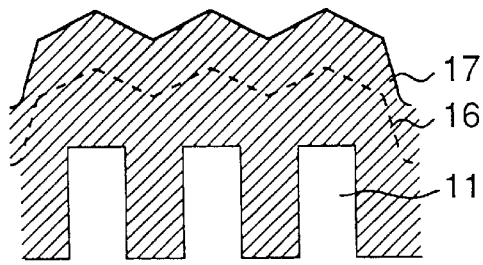
Figure 3E:
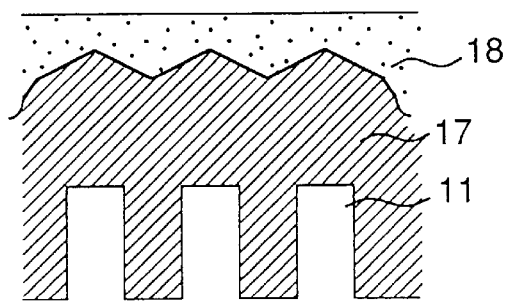
Figure 3F:
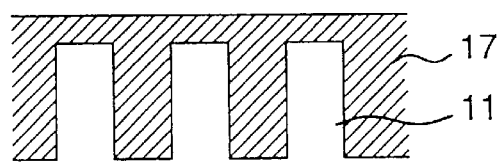

Then, a silicon oxide film 17 is deposited by a thickness of 1 $\mu$m again using the capacitive coupling type electrical discharge as shown in FIG. 3D so as to secure a film thickness at a high velocity. A provided deposition condition is the same as the preceding silicon oxide film deposition condition using the capacitive coupling type electrical discharge. Through the aforementioned process, formation of a silicon oxide film free of voids is completed. However, if a further flatness is required, a resin layer 18 such as a resist is formed on the silicon oxide film 17 as shown in FIG. 3E. Finally, by performing a dry etching process with an etch selectivity of the resin layer 18 to the silicon oxide film 17 being 1:1 as shown in FIG. 3F, a flat silicon oxide film can be obtained without leaving the resin layer 18.

Figure 4A:
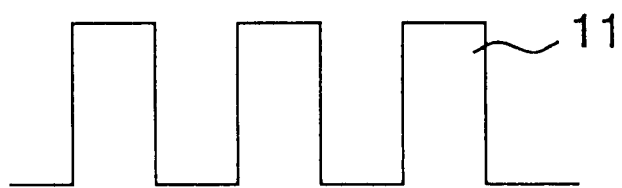
FIGS. 4A, 4B, 4C, and 4D are schematic views of a third thin film forming process of the first embodiment.
Figure 4B:
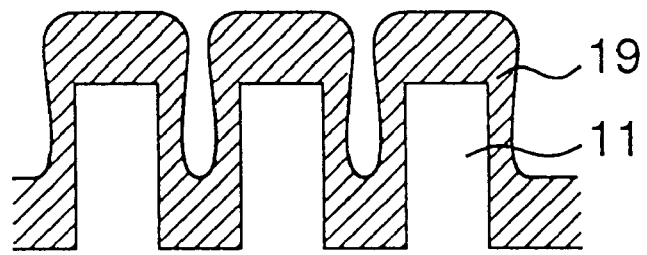
Figure 4C:
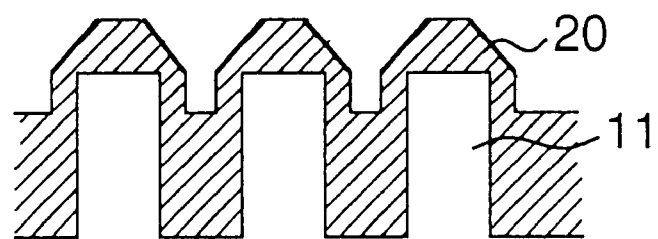
Figure 4D:
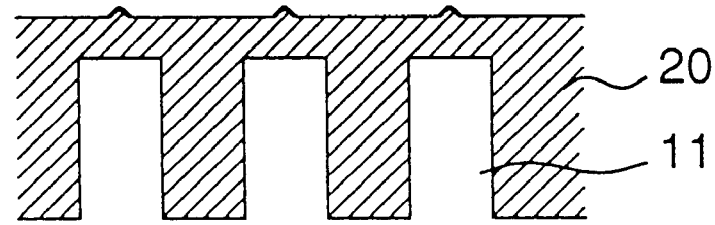

Next, a third thin film forming method for forming a silicon oxide film on a similar stepped portion of aluminum by means of the thin film forming apparatus shown in FIG. 1 will be described with reference to FIGS. 4A through 4D. In FIGS. 4A through 4D, on a stepped portion 11 as shown in FIG. 4A, firstly a silicon oxide film 19 is deposited by a thickness of 0.5 μm using the capacitive coupling type electrical discharge as shown in FIG. 4B. There is provided a deposition condition of: a TEOS flow rate of 80 sccm and an oxygen flow rate of 200 sccm; a pressure of 6 Torr; and high-frequency powers of 360 W and 120 W to be applied respectively to the upper electrode 2 and the lower electrode 3. Then, CVD reaction and sputter etching are simultaneously effected using the inductive coupling type electrical discharge as shown in FIGS. 4C and 4D so as to perform deposition and shoulder removal (shaping) of a silicon oxide film 20. There is provided a processing condition of: a TEOS flow rate of 20 sccm, an oxygen flow rate of 50 sccm, and an argon flow rate of 50 sccm; a pressure of 5 mTorr; and high-frequency powers of 1000 W and 200 W to be applied respectively to the coil 8 and the lower electrode 3. It is to be noted that FIG. 4C shows a condition in the middle of the process using the inductive coupling type electrical discharge. Through the aforementioned process, formation of a silicon oxide film having no voids and a high flatness is completed.

Figure 5A:
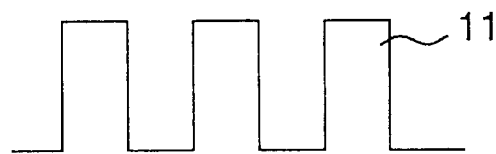
FIGS. 5A, 5B, 5C, 5D, and 5E are schematic views of a fourth thin film forming process of the first embodiment.
Figure 5B:
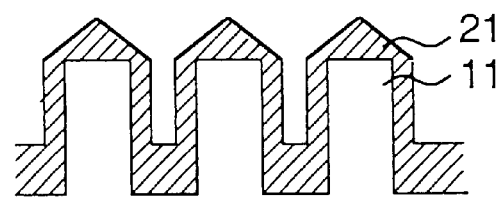
Figure 5C:
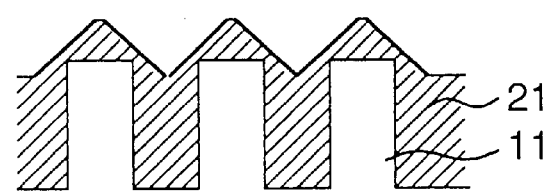
Figure 5D:
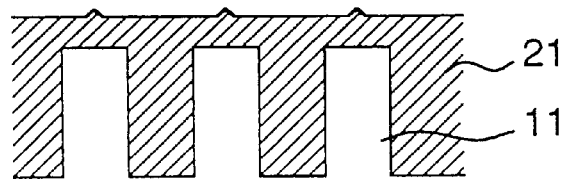
Figure 5E:
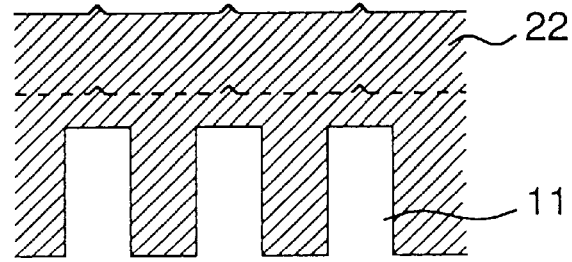

Next, a fourth thin film forming method for forming a silicon oxide film on a similar stepped portion of aluminum by means of the thin film forming apparatus shown in FIG. 1 will be described with reference to FIGS. 5A through 5E. In FIGS. 5A through 5E, on a stepped portion 11 as shown in FIG. 5A, firstly a process of deposition and shoulder removal (shaping) of a silicon oxide film 21 is performed by simultaneously performing CVD reaction and sputter etching using the inductive coupling type electrical discharge, as shown in FIGS. 5B through 5D. There is provided a processing condition of: a TEOS flow rate of 20 sccm, an oxygen flow rate of 50 sccm, and an argon flow rate of 50 sccm; a pressure of 5 mTorr; and high-frequency powers of 1000 W and 200 W to be applied respectively to the coil 8 and the lower electrode 3. It is to be noted that FIGS. 5B and 5C show a condition in the middle of the process using the inductive coupling type electrical discharge. Then, a silicon oxide film 22 is deposited using the capacitive coupling type electrical discharge as shown in FIG. 5E. There is provided a deposition condition of: a TEOS flow rate of 80 sccm and an oxygen flow rate of 200 sccm; a pressure of 6 Torr; and high-frequency powers of 360 W and 120 W to be applied respectively to the upper electrode 2 and the lower electrode 3. Through the aforementioned process, formation of a silicon oxide film having no voids and a high flatness is completed.

Next a thin film forming apparatus according to a second embodiment will be described with reference to FIG. 6.

Figure 6:
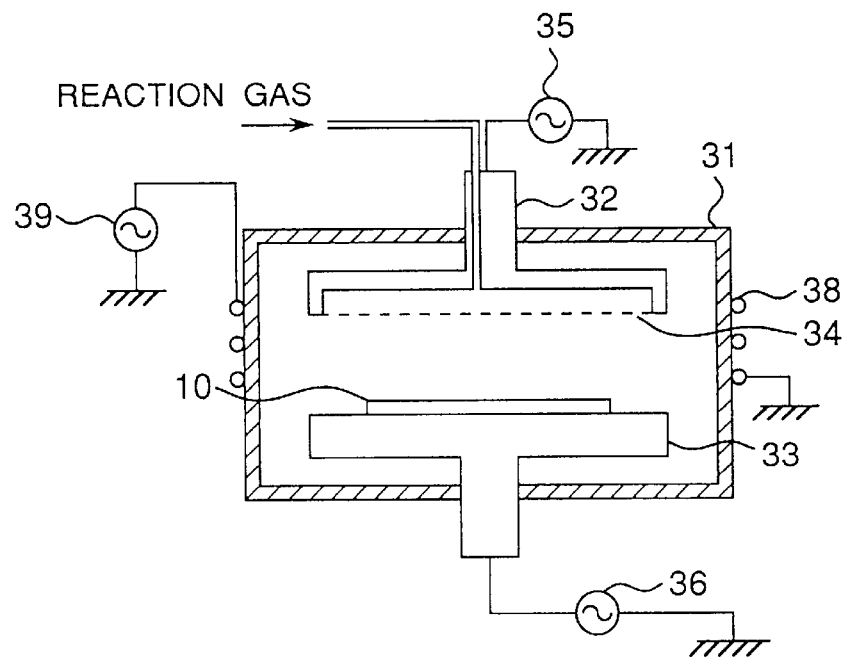
FIG. 6 is a diagram showing a structure of a thin film forming apparatus according to a second embodiment of the present invention.

In FIG. 6, an upper electrode 32 and a lower electrode 33 are placed in parallel with each other in a processing chamber 31. The upper electrode 32 has numerous gas inlets 34 each having a hole diameter of 0.5 mm on a side opposite to the lower electrode 33. The upper electrode 32 is connected to an upper electrode high-frequency power source 35, while the lower electrode 33 is connected to a lower electrode high-frequency power source 36. The upper electrode 32, lower electrode 33, upper electrode high-frequency power source 35, and lower electrode high-frequency power source 36 constitute a means for generating a so-called capacitive coupling type electrical discharge. The processing chamber 31 is composed of an insulating material, and a coil 38 is provided around the chamber 31. The coil 38 is connected to a coil use high-frequency power source 39. The coil 38 and the coil high-frequency power source 39 constitute a means for generating so-called inductive coupling type electrical discharge. A substrate 10 is disposed on the lower electrode 33.

The aforementioned first, second, third, and fourth thin film forming methods can each be performed by means of the thin film forming apparatus of the second embodiment.

According to the above description, there have been exemplified a construction in which the coil 8 is provided inside the insulating ring 7 provided around the upper electrode 2 in the first embodiment and a construction in which the coil 38 is provided around the periphery of the processing chamber 31 composed of an insulating material in the second embodiment. However, the coil position is not limited to the above-mentioned positions. For instance, a coil may be provided inside an insulating ring provided along the internal wall of the processing chamber, or may be provided inside the processing chamber without being covered with an insulating material.

The upper electrode high-frequency power sources 5 and 35 and the coil high-frequency power sources 9 and 39 are individually provided in each of the aforementioned embodiments. However, there may be used a system in which one high-frequency power source is commonly used and switched over according to each process.

Figure 7:
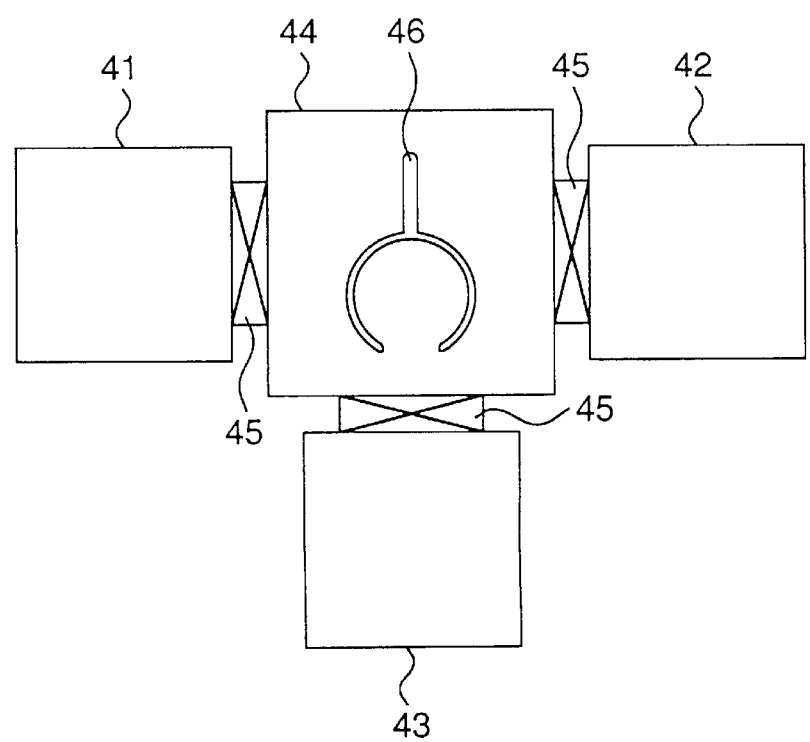
FIG. 7 is a diagram showing a total structure of a thin film forming apparatus according to a third embodiment of the present invention.

Next, a thin film forming apparatus according to a third embodiment will be described with reference to FIGS. 7 through 9. In FIG. 7, a first processing chamber 41 for performing a capacitive coupling type plasma processing, a second processing chamber 42 for performing an inductive coupling type plasma processing, and a reserve chamber 43 are connected with each other via a transfer chamber 44 and gates 45. The transfer chamber 44 is provided with a transfer arm 46.

Figure 8:
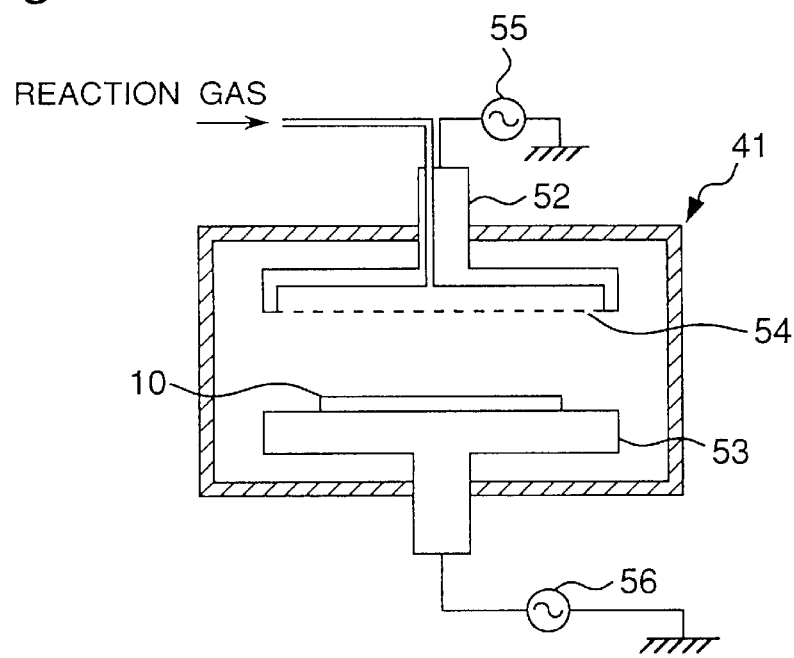
FIG. 8 is a diagram showing a structure of a capacitive coupling type plasma processing chamber of the third embodiment.

FIG. 8 shows a detailed construction of the first processing chamber 41 for performing the capacitive coupling type plasma processing shown in FIG. 7. In FIG. 8, an upper electrode 52 and a lower electrode 53 are placed in parallel with each other in a processing chamber 41. The upper electrode 52 has numerous (about 4000) of gas inlets 54 each having a hole diameter of 0.5 mm on a side opposite to the lower electrode 53. The upper electrode 52 is connected to an upper electrode high-frequency power source 55, while the lower electrode 53 is connected to a lower electrode high-frequency power source 56.

In the above-mentioned construction, by introducing TEOS and oxygen from the gas inlets 54 into the processing chamber 41 while discharging a gas therefrom with a substrate 10 disposed on the lower electrode 53, and applying high-frequency voltages to the upper electrode 52 and the lower electrode 53 with the processing chamber 41 maintained internally at an appropriate pressure, plasma is generated inside the processing chamber 41, thereby allowing a silicon oxide film to be deposited on the substrate 10.

Figure 9:
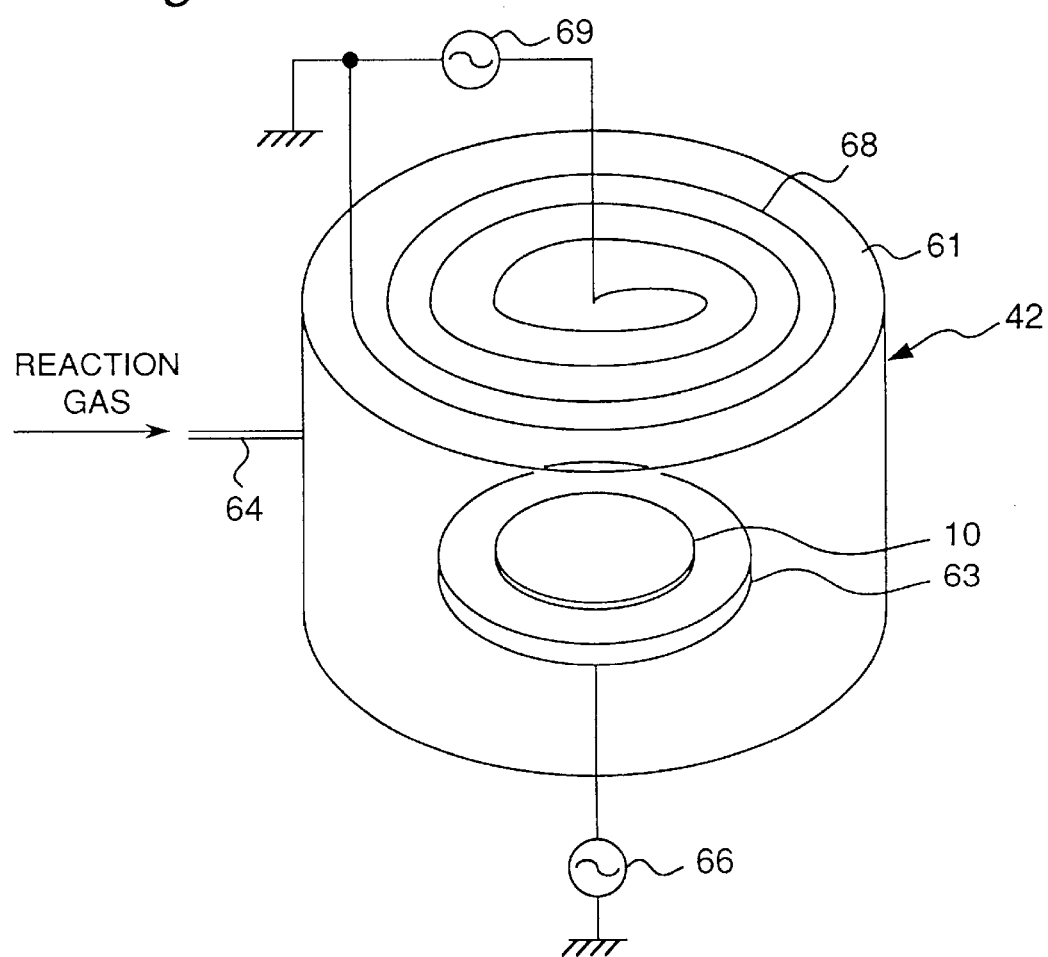
FIG. 9 is a diagram showing a structure of an inductive coupling type plasma processing chamber of the third embodiment.
Figure 10:
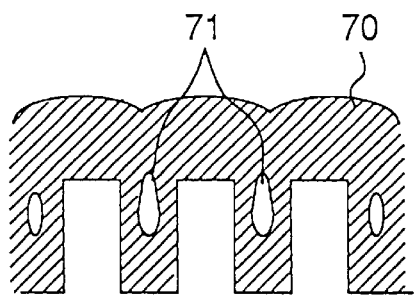
FIG. 10 is a schematic view of a prior art thin film forming process.
Figure 11A:
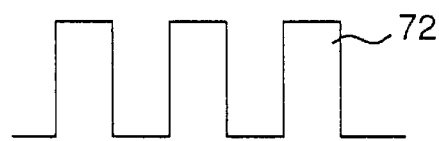
FIGS. 11A, 11B, 11C, and 11D are schematic views of another prior art thin film forming process of a prior art.
Figure 11B:
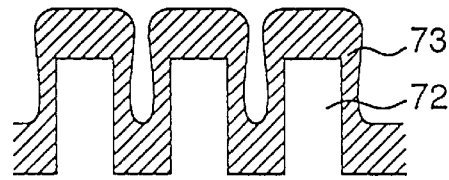
Figure 11C:
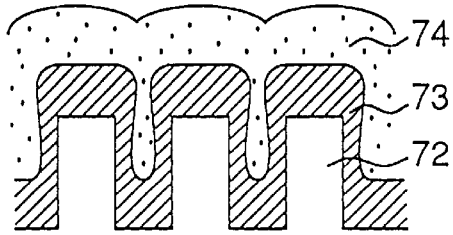
Figure 11D:
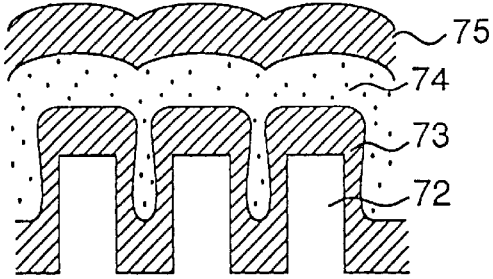
Figure 12A:
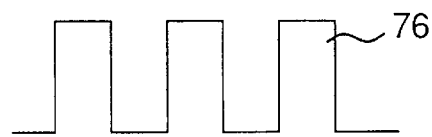
FIGS. 12A, 12B, 12C, 12D, 12E, and 12F are schematic views of yet another prior art thin film forming process.
Figure 12B:
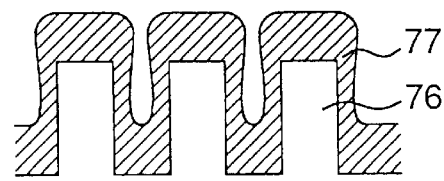
Figure 12C:
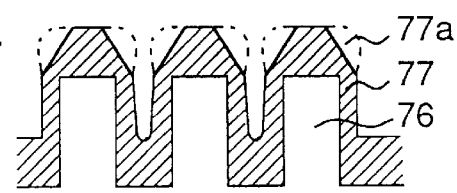
Figure 12D:
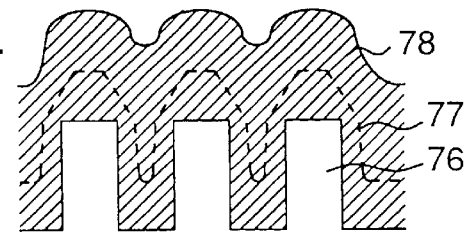
Figure 12E:
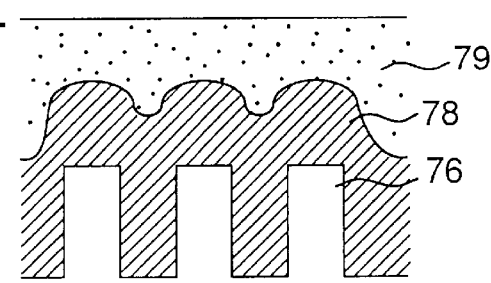
Figure 12F:
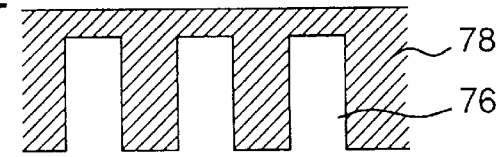
Figure 13:
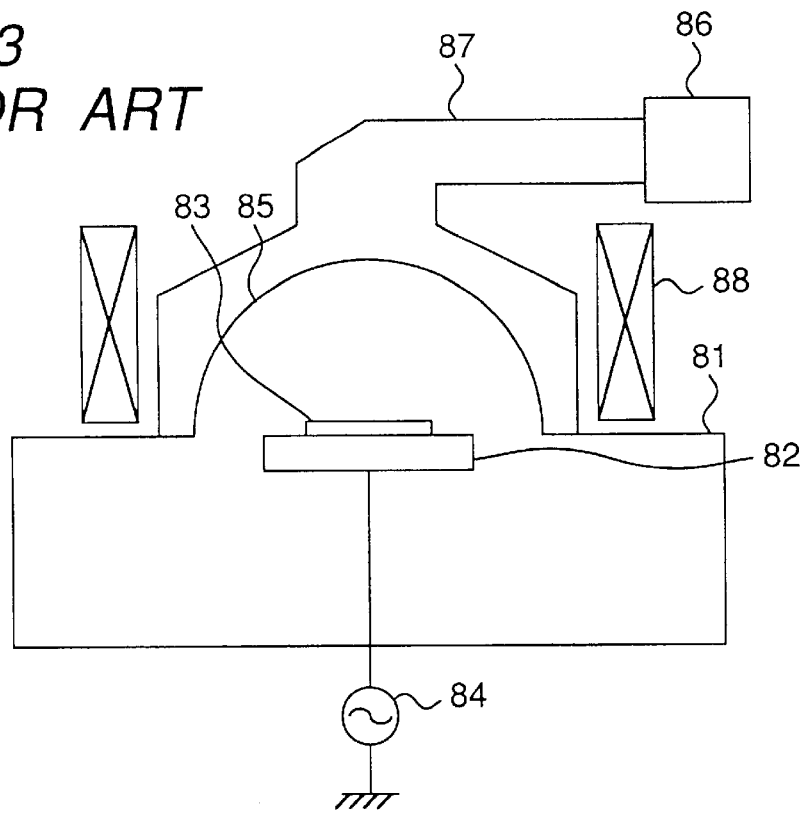
FIG. 13 is a diagram showing a structure of a prior art ECR bias CVD apparatus.
Figure 14A:
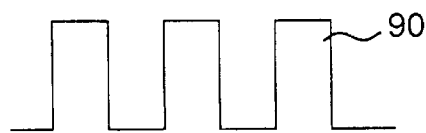
FIGS. 14A, 14B, 14C, and 14D are schematic views of a thin film forming process according to a prior art ECR bias CVD method.
Figure 14B:
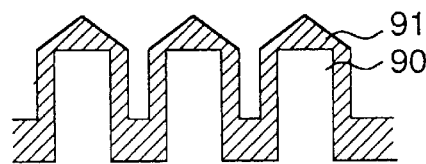
Figure 14C:
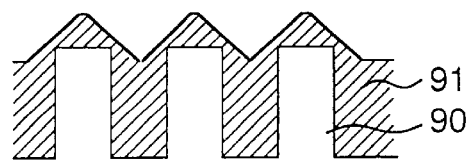
Figure 14D:
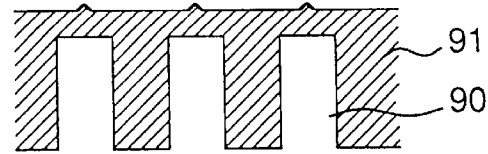

FIG. 9 shows a detailed construction of the second processing chamber 42 for performing the inductive coupling type plasma processing shown in FIG. 7. In FIG. 9, a lower electrode 63 is placed in the processing chamber 42. A coil 68 is provided in a plane via an insulating plate 61 above the processing chamber 42. The coil 68 is connected to a coil high-frequency power source 69, while the lower electrode 63 is connected to a lower electrode high-frequency power source 66.

In the above-mentioned construction, by introducing TEOS, oxygen, and argon gases from a gas inlet 64 into the processing chamber 42 while discharging a gas therefrom with the substrate 10 disposed on the lower electrode 63, and applying high-frequency powers to the coil 68 and the lower electrode 63 with the processing chamber 42 maintained internally at an appropriate pressure, plasma is generated inside the processing chamber 42, thereby allowing a silicon oxide film to be deposited on the substrate 10 while simultaneously shaping the silicon oxide film by sputter etching. Otherwise, by introducing oxygen or argon gas from the gas inlet 64 into the processing chamber 42 with the substrate 10 disposed on the lower electrode 63, and applying high-frequency powers to the coil 68 and the lower electrode 63 with the processing chamber 42 maintained internally at an appropriate pressure, plasma is generated inside the processing chamber 42, thereby allowing the silicon oxide film to be shaped by sputter etching.

The aforementioned first through fourth thin film forming methods can each be performed by means of the thin film forming apparatus as shown in FIGS. 7 through 9.

The thin film formation is performed by means of the thin film forming apparatus where the capacitive coupling type plasma processing chamber and the inductive coupling type plasma processing chamber are connected with each other in the third embodiment. However, the process may be performed by means of an independent capacitive coupling type plasma processing device and an independent inductive coupling type plasma processing device.

There is exemplified the process in which a silicon oxide film is formed on a stepped portion of aluminum in each of the aforementioned embodiments. However, the present invention can also be applied to another process. For instance, the present invention can be applied to a process of forming a silicon nitride film to be used as a protecting film.

According to the film forming method of the present invention, plasma is generated in the processing chamber by applying a high-frequency voltage to the coil. Such a discharge is generally referred to as an inductive coupling type electrical discharge.. According to the inductive coupling type electrical discharge, plasma can be easily generated at a high vacuum (not greater than 10 mTorr) and a high density (not smaller than $10^{11}$ cm$^{-3}$). The inductive coupling type electrical discharge is described in detail in a document of: J. Hopwood, "Review of inductively coupled plasmas for plasma processing" Plasma Sources Sci. Technol. 1 (1992), p. 109. The discharge has a characteristic having a close resemblance to that of ECR plasma, and is capable of not only performing thin film shaping (shoulder removal) at an extremely high velocity in comparison with that of the dry etching apparatus having two electrodes, but also simultaneously performing thin film deposition and thin film shaping by sputter etching, which is similar to ECR bias CVD. Unlike ECR plasma, the inductive coupling type electrical discharge essentially requires no magnetic field, and therefore the dielectric breakdown of a thin insulating film as generated in the ECR plasma hardly occurs.

However, on a simple comparison in regard to a thin film deposition rate, thin film deposition can be achieved more speedily with the conventional capacitive coupling type electrical discharge where high-frequency voltages are applied to the electrodes than with the inductive coupling type electrical discharge.

As apparent from the above description, according to the first aspect of the present invention, by performing the first thin film deposition at a high velocity by applying high-frequency voltages to the electrodes, performing the thin film shaping at a high velocity by applying a high-frequency voltage to the coil, and performing the second thin film deposition at a high velocity by applying high-frequency voltages to the electrodes, a quality thin film can be formed at a high velocity. Further, by stopping the first thin film deposition before the open ends of recess portions due to the stepped portion are closed by the thin film deposited on the substrate surface and effecting the thin film shaping process until a portion having a narrow width substantially disappears on the open end side relative to the bottom portion of each recess portion, a thin film having a desired thickness can be formed at a high velocity without the occurrence of voids.

Furthermore, according to the thin film forming method of the second aspect of the present invention, by performing the first thin film deposition at a high velocity by applying high-frequency voltages to the electrodes, and simultaneously performing the second thin film deposition and the thin film shaping by applying a high-frequency voltage to the coil, a quality thin film can be formed at a high velocity. Further, by effecting the processing of performing the second thin film deposition and the thin film shaping up to the maximum film thickness at which no recess portion is left as a void due to the stepped portion in the processing, a thin film can be formed at a higher velocity. Further, by adding the process of performing the third thin film deposition by applying high-frequency voltages to the electrodes, a thin film can be formed at a higher velocity.

Furthermore, according to the thin film forming method of the third aspect of the present invention, by simultaneously performing the first thin film deposition and the thin film shaping by applying a high-frequency voltage to the coil, and performing the second thin film deposition at a high velocity by applying high-frequency voltages to the electrodes, a quality thin film can be formed at a high velocity. Further, by effecting the processing of performing the first thin film deposition and the thin film shaping up to the minimum film thickness at which no recess portion is left due to the stepped portion in the processing, a thin film can be formed at a higher velocity.

By adding the process of coating the substrate surface with a resin and dry-etching the resin and the ground thin film at a uniform rate to each of the above-mentioned thin film forming methods, a thin film having an excellent flatness can be formed.

The aforementioned thin film forming methods are each effective particularly when the aspect ratio is not smaller than one and the bottom length is not greater than 0.8 $\mu$m, and effectively applicable to formation of a silicon oxide film or a silicon nitride film.

The thin film forming apparatus according to the fourth aspect of the present invention comprises the processing chamber implemented by the vacuum vessel, the electrode for substrate use on which a substrate is to be disposed, the opposite electrode which is arranged in opposition to the substrate electrode and to which a high-frequency voltage is applied, and the coil which receives a high-frequency voltage applied thereto and generates a high-frequency discharge. Therefore, the aforementioned thin film forming method can be performed with one apparatus, thereby allowing a quality thin film to be formed at a high velocity. The coil may be placed either inside the processing chamber or outside the processing chamber. When the coil is placed around the opposite electrode, a simple support structure for placing the coil can be achieved.

According to the thin film forming apparatus of the fifth aspect of the present invention, a capacitive coupling type electrical discharge can be generated in the plasma processing chamber provided with an electrode in a vacuum vessel, and an inductive coupling type electrical discharge can be generated in the plasma processing chamber provided with the coil in a vacuum vessel. Therefore, by transferring a substrate between the plasma processing chambers, the aforementioned thin film forming method can be performed with one apparatus, thereby allowing a quality thin film to be formed at a high velocity.

Although the present invention has been fully described in connection with preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A thin film forming method for forming a thin film on a surface of a substrate having a stepped surface portion, said method comprising:

disposing the substrate in a processing chamber having therein a coil, and first and second opposing electrodes which face each other, such that the substrate is provided at said first electrode;

performing, in said processing chamber, a first thin film deposition by generating plasma in said processing chamber by applying high-frequency voltage to at least said second electrode;

performing, in said processing chamber, thin film shaping by generating plasma in said processing chamber by applying high-frequency voltage to the coil; and performing, in said processing chamber, a second thin film deposition by generating plasma in said processing chamber by applying high-frequency voltage to at least said second electrode.

2. A thin film forming method as recited in claim 1, wherein the substrate disposed in said processing chamber is stepped in such a manner that a recess portion is formed at the surface of the substrate; and said performing of the first thin film deposition is stopped before an open end of the recess portion is closed, and said performing of the thin film shaping is effected until a portion of the thin film at the open end of the recess portion, narrow in width relative to a portion of the thin film at a bottom end of the recess portion, substantially disappears.

3. A thin film forming method as recited in claim 1, further comprising coating the surface of the substrate with a resin; and dry-etching the resin and a ground thin film at a uniform rate.

4. A thin film forming method as recited in claim 1, wherein the stepped portion of the substrate disposed in said processing chamber has an aspect ratio of at least one and a length in vertical section of a bottom portion of the stepped portion of no greater than 0.8 microns.

5. A thin film forming method for forming a thin film on a surface of a substrate having a stepped surface portion, said method comprising:

disposing the substrate in a processing chamber having therein a coil, and first and second opposing electrodes which face each other, such that the substrate is provided at said first electrode;

performing, in said processing chamber, a first thin film deposition by generating plasma in said processing chamber by applying high-frequency voltage to at least said second electrode; and simultaneously performing, in said processing chamber, a second thin film deposition and thin film shaping by generating plasma in said processing chamber by applying high-frequency voltage to the coil.

6. A thin film forming method as recited in claim 5, wherein the substrate disposed in said processing chamber is stepped in such a manner that a recess portion is formed at the surface of the substrate; and said performing of the first thin film deposition is effected up to a maximum film thickness which will allow said simultaneous performing of the second thin film deposition and the thin film shaping to leave no void in the recess portion.

7. A thin film forming method as recited in claim 5, further comprising performing, in said processing chamber, a third thin film deposition by generating plasma in said processing chamber by applying high-frequency voltage to at least said second electrode.

8. A thin film forming method as recited in claim 5, further comprising coating the surface of the substrate with a resin; and dry-etching the resin and a ground thin film at a uniform rate.

9. A thin film forming method as recited in claim 5, wherein the stepped portion of the substrate disposed in said processing chamber has an aspect ratio of at least one and a length in vertical section of a bottom portion of the stepped portion of no greater than 0.8 microns.

10. A thin film forming method for forming a thin film on a surface of a substrate having a stepped surface portion, said method comprising:

disposing the substrate in a processing chamber having therein a coil, and first and second opposing electrodes which face each other, such that the substrate is provided at said first electrode;

simultaneously performing, in said processing chamber, a first thin film deposition and thin film shaping by generating plasma in said processing chamber by applying high-frequency voltage to the coil; and performing, in said processing chamber, a second thin film deposition by generating plasma in said processing chamber by applying high-frequency voltage to at least said second electrode.

11. A thin film forming method as recited in claim 10, wherein the substrate disposed in said processing chamber is stepped in such a manner that a recess portion is formed at the surface of the substrate; and said performing of the first thin film deposition and the thin film shaping is effected until said recess portion is substantially eliminated.

12. A thin film forming method as recited in claim 11, further comprising coating the surface of the substrate with a resin; and dry-etching the resin and a ground thin film at a uniform rate.

13. A thin film forming method as recited in claim 11, wherein the stepped portion of the substrate disposed in said processing chamber has an aspect ratio of at least one and a length in vertical section of a bottom portion of the stepped portion of no greater than 0.8 microns.

14. A thin film forming method as recited in claim 10, wherein at least one of said first and second thin films is a silicon oxide film.

15. A thin film forming method as recited in claim 10, wherein at least one of said first and second thin films is a silicon nitride film.

* * * * *